United States Patent
Jamin et al.

(10) Patent No.: US 8,401,116 B2
(45) Date of Patent: Mar. 19, 2013

(54) RF RECEIVER

(75) Inventors: Olivier Jamin, Sainte Honorine du Fay (FR); Luca Lococo, Anisy (FR); Fernand Courtois, Saint-Contest (FR); Amandine Lesellier, Caen (FR)

(73) Assignee: NXP B.V., Eindhoven (NL)

( * ) Notice: Subject to any disclaimer, the term of this patent is extended or adjusted under 35 U.S.C. 154(b) by 92 days.

(21) Appl. No.: 12/972,888

(22) Filed: Dec. 20, 2010

(65) Prior Publication Data
US 2011/0150069 A1  Jun. 23, 2011

(30) Foreign Application Priority Data
Dec. 18, 2009 (EP) .................................. 09290974

(51) Int. Cl.
*H03K 9/00* (2006.01)
*H04K 3/00* (2006.01)

(52) U.S. Cl. ....................... 375/316; 375/346
(58) Field of Classification Search .......... 375/229–333, 375/346
See application file for complete search history.

(56) References Cited

U.S. PATENT DOCUMENTS

| 4,967,169 A | 10/1990 | Sun et al. | |
|---|---|---|---|
| 6,047,601 A * | 4/2000 | Foster | 73/602 |
| 6,941,079 B1 * | 9/2005 | Barozzi et al. | 398/157 |
| 2002/0196876 A1 * | 12/2002 | Takada | 375/346 |

FOREIGN PATENT DOCUMENTS

| WO | 01/43383 A1 | 6/2001 |
|---|---|---|
| WO | 2007/145637 A1 | 12/2007 |

OTHER PUBLICATIONS

Wu, M. et al. "Analog Baseband Receiver Chip for 100Mbps/1Gbps Broadband Symmetric Cable Modem," Proc. of the IEEE 2002 Bipolar/BiCMOS Circuits and Tech. Mtg., pp. 185-188 (Sep. 2002).

\* cited by examiner

*Primary Examiner* — Lee Nguyen

(57) ABSTRACT

An RF receiver comprising: an amplifier configured to receive an RF signal over an input bandwidth and to provide an amplified RF signal; an equalizer circuit connected to the amplifier to receive the amplified RF signal and configured to provide an equalized RF signal; a converter module connected to the equalizer circuit and comprising an analog to digital converter configured to convert the equalized RF signal to a digital signal; and a digital signal processing module connected to the receiver module and configured to process the digital signal to provide a plurality of channels at an output of the receiver, wherein the digital signal processing module is further configured to process the digital signal to determine a measure of tilt in the RF signal across the input bandwidth and is connected to the equalizer circuit to provide a control signal for adjusting the measured tilt.

17 Claims, 10 Drawing Sheets

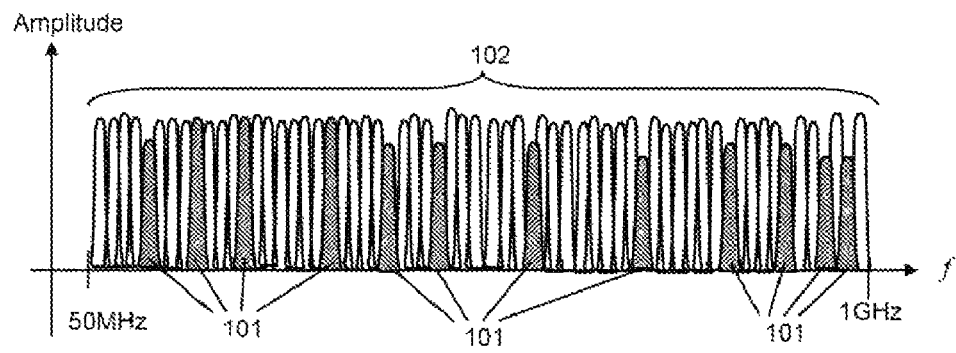
(Prior Art)  Fig. 1
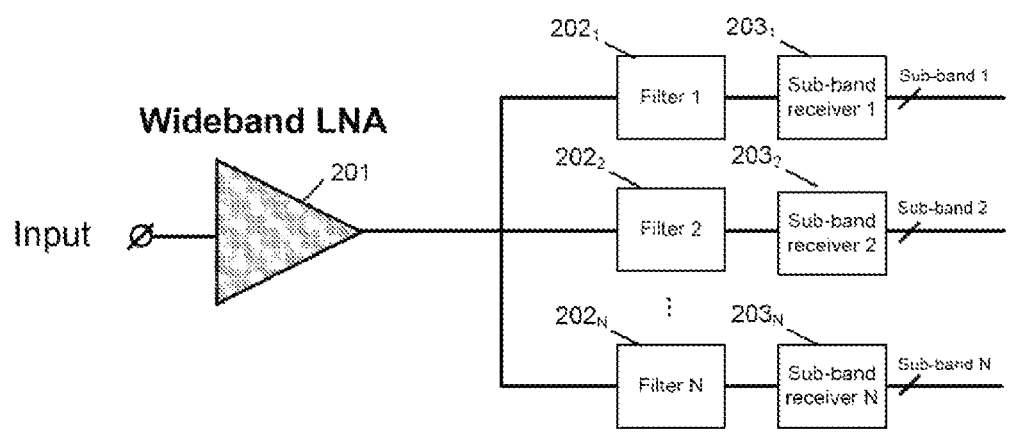
(Prior Art)  Fig. 2

RF RECEIVER

This application claims the priority under 35 U.S.C. §119 of European patent application no. 09290974.6, filed on Dec. 18, 2009, the contents of which are incorporated by reference herein.

FIELD OF THE INVENTION

The invention relates to radio frequency receivers for the simultaneous reception of multiple channels, for example for use in cable television receiver units.

BACKGROUND OF THE INVENTION

Cable television receivers typically need to deal concurrently with reception of around 6 channels, some of which may be for video signals and others for data signals. These requirements are likely to increase in future, in order to meet increasing data bandwidth requirements and multiple video signals for distribution via a 'home gateway' modem. This may, for example, necessitate the concurrent reception of 12 or more channels located anywhere in a 1 GHz bandwidth. FIG. 1 illustrates schematically a possible location of 12 wanted channels 101 selected out of a number of available channels 102 over a bandwidth from 50 MHz to 1 GHz. The 12 channels may, for example, represent 8 channels for high-speed internet and 4 video channels.

Depending on frequency planning by the operator of the cable service (which may be a multiple system operator, or MSO), the lower part of the spectrum (for example 50 MHz to 550 MHz) may be occupied with analogue channels, while the upper part of the spectrum (550 MHz to 1 GHz) may be reserve for digital channels and data. The concurrent reception of several channels may therefore be limited to the 550 MHz-1 GHz band only.

Using traditional single-channel receiver techniques, concurrent reception of 12 channels would require 12 single-channel receivers, which leads to an unacceptably high cost system solution.

Therefore, there is a current interest in developing broadband receivers that allow for the concurrent reception of a number of channels.

A wideband analog to digital converter (ADC) may be used to convert the whole 1 GHz RF input signal, allowing selection of individual channels to be carried out in the digital domain. However, wideband ADCs are difficult to implement, particularly over such a large bandwidth, and may have a limited dynamic range.

A possible solution is to split the input signal bandwidth into multiple smaller bandwidths, as for example disclosed in WO 2007/145637, in which multiple amplifier-filter circuits are configured to receive and separate a multichannel RF input signal into corresponding analog signals in different frequency bands. Multiple ADCs are provided for converting each analog signal into a digital signal. This type of solution is illustrated schematically in FIG. 2, in which a single wideband low noise amplifier (LNA) 201 provides an amplified RF signal to multiple filters $202_1$-$202_N$ and multiple sub-band receivers $203_1$-$203_N$. This type of solution, however, requires the use of multiple ADCs, so that each ADC has only a limited portion of the input bandwidth to process, and uses multiple amplifiers and filters, thereby increasing the complexity of the receiver. The issue of dynamic range of each ADC is also not considered.

It is an object of the invention to address one or more of the above mentioned problems.

SUMMARY OF THE INVENTION

In accordance with a first aspect of the invention there is provided an RF receiver comprising:
an amplifier configured to receive an RF signal over an input bandwidth and to provide an amplified RF signal;
an equalizer circuit connected to the amplifier to receive the amplified RF signal and configured to provide an equalized RF signal;
a converter module connected to the equalizer circuit and comprising an analog to digital converter configured to convert the equalized RF signal to a digital signal; and
a digital signal processing module connected to the converter module and configured to process the digital signal to provide a plurality of channels at an output of the receiver,
wherein the digital signal processing module is further configured to process the digital signal to determine a measure of tilt in the RF signal across the input bandwidth and is connected to the equalizer circuit to provide a control signal for adjusting the measured tilt.

The digital signal processing module is optionally configured to provide a control signal to the equalizer circuit to reduce the measure of tilt in the RF signal output from the equalizer circuit.

The equalizer circuit is optionally configured to provide, under control of the control signal from the digital signal processing module, a positive tilt equalization to the amplified RF signal in a first operational mode and a negative tilt equalization to the amplified RF signal in a second operational mode.

The equalizer circuit optionally comprises a coupled inductor-capacitor resonator arranged in parallel when the equalizer circuit is in the first operational mode and in series when the equalizer circuit is in the second operational mode.

The equalizer circuit may comprise a network of switchable impedance elements configured to provide a selectable degree of tilt applied by the equalizer circuit to the amplified RF signal under control of the control signal from the digital signal processing module. The impedance elements may comprise resistors and capacitors.

The RF receiver may comprise two or more of said equalizer circuits, converter modules and digital signal processing modules, each equalizer circuit being connected to the amplifier via a respective filter configured to select a portion of the input bandwidth.

A first one of said filters may be configured as a low pass filter to provide a lower portion of the input bandwidth to a first one of the equalizer circuits, while a second one of said filters may be configured as a high pass filter to provide an upper portion of the input bandwidth to a second one of the equalizer circuits.

The second converter may comprise a downmixer connected to the second equalizer circuit, the downmixer being configured to mix the equalized RF signal with a local oscillator signal to provide an intermediate frequency signal to the analog to digital converter of the second converter module.

Advantages of the above features are apparent from the following description of various exemplary embodiments.

BRIEF DESCRIPTION OF THE DRAWINGS

The invention is described in further detail below by way of example and with reference to the accompanying drawings, in which:

FIG. 1 is a schematic representation of an input signal bandwidth comprising a plurality of channels;

FIG. 2 is a block diagram of a front end of a receiver having multiple paths and a single wideband amplifier;

DETAILED DESCRIPTION OF EMBODIMENTS

Figure 3:
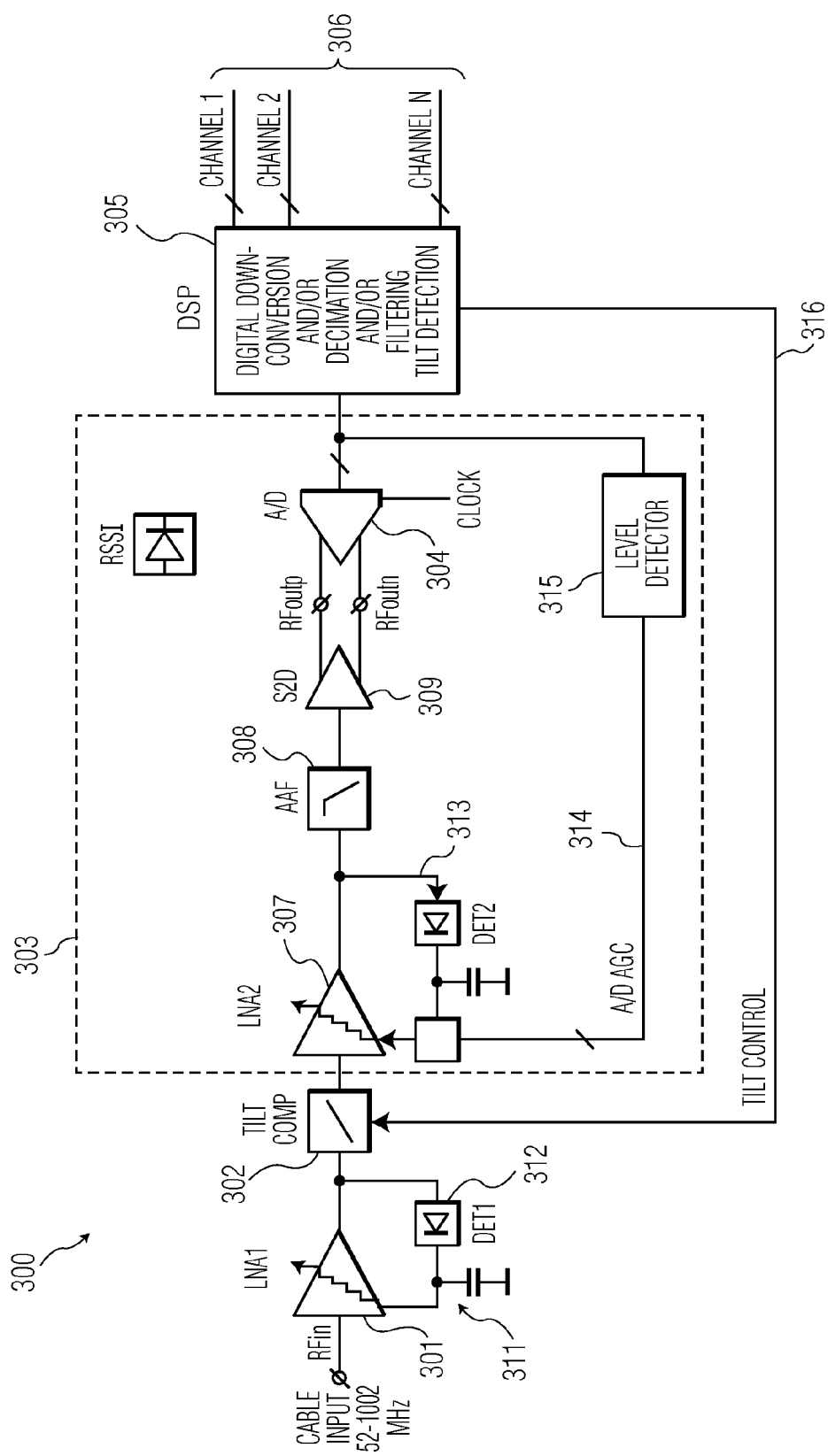
FIG. 3 is a block diagram of a receiver having a single ADC signal path.

An exemplary embodiment of a multi-channel receiver 300 is shown in FIG. 3. The receiver 300 comprises a front-end low noise RF amplifier (LNA) 301. The LNA 301 preferably has an adjustable gain, which is controlled by a feedback loop 311 comprising a level detector circuit 312 such that the output of the LNA 301 is maintained at a predefined level.

The output of the LNA 301 is connected to the input of a tilt compensation equalizer 302. The tilt equalizer 302 is configured to equalize the amplified RF signal so as to reduce or remove a tilt in the amplitude of the RF signal across the signal bandwidth.

For the purpose of this disclosure, the term 'tilt' is intended to indicate a non-uniform amplitude distribution across a signal bandwidth, where the non-uniformity is characterised by one side of the bandwidth having a higher amplitude than the other. One example of a tilt would be a high frequency roll-off in the amplitude of the RF signal. The tilt equalizer 302 is configured to compensate for this uneven amplitude distribution by having an adjustable transfer function that may have either a positive or a negative slope across the bandwidth.

The output of the tilt equalizer 302 is connected to a converter module 303 comprising an analogue to digital converter (ADC) 304. In the embodiment shown in FIG. 3, the converter module 303 also includes a further adjustable low noise amplifier 307, the gain of which is controllable by a first feedback loop 314 connected to the output of the ADC 304, the first feedback loop 314 comprising a level detector 315. A second optional feedback loop 313 may be used for providing additional degrees of freedom on the noise/linearity trade-off by giving a local RF signal power estimate.

A low-pass filter 308 is connected to the output of the second LNA 307, which filters out any signals above the bandwidth of interest. In this embodiment the output of the low-pass filter 308 is connected to a single to differential converter 309, which converts the amplified and equalized RF signal into differential form, suitable for input to the ADC 304. In alternative embodiments, all or part of the RF path may be differential or single-ended. The output of the ADC, which in this case coincides with the output of the converter module 303 is connected to a digital signal processing module (DSP) 305. The DSP 305 converts the digital signal representing the entire bandwidth into separate individual digital channels 306 by digital down-conversion, decimation and filtering. The DSP also analyses the amplitude spectrum of the digitised RF signal and determines the degree of tilt in the signal, which may for example be represented by a degree of roll-off in the higher frequency portion of the signal. A control signal is provided from the DSP 305 to the tilt equalizer 302 via a control signal line 316 for adjusting the degree of tilt compensation applied by the tilt equalizer 302. As well as correcting for any tilt in the RF signal output by the tilt equalizer 302, the control signal applied by the DSP 305 may also correct for any additional tilt resulting from the components between the tilt equalizer 302 and the DSP 305.

The slope of the tilt equalizer may alternatively be controlled by one or more of the performance indicators derived from the demodulated channels by the DSP 205, such performance indicators including for example the modulation error rate and bit error rate of the channels.

Figure 4:
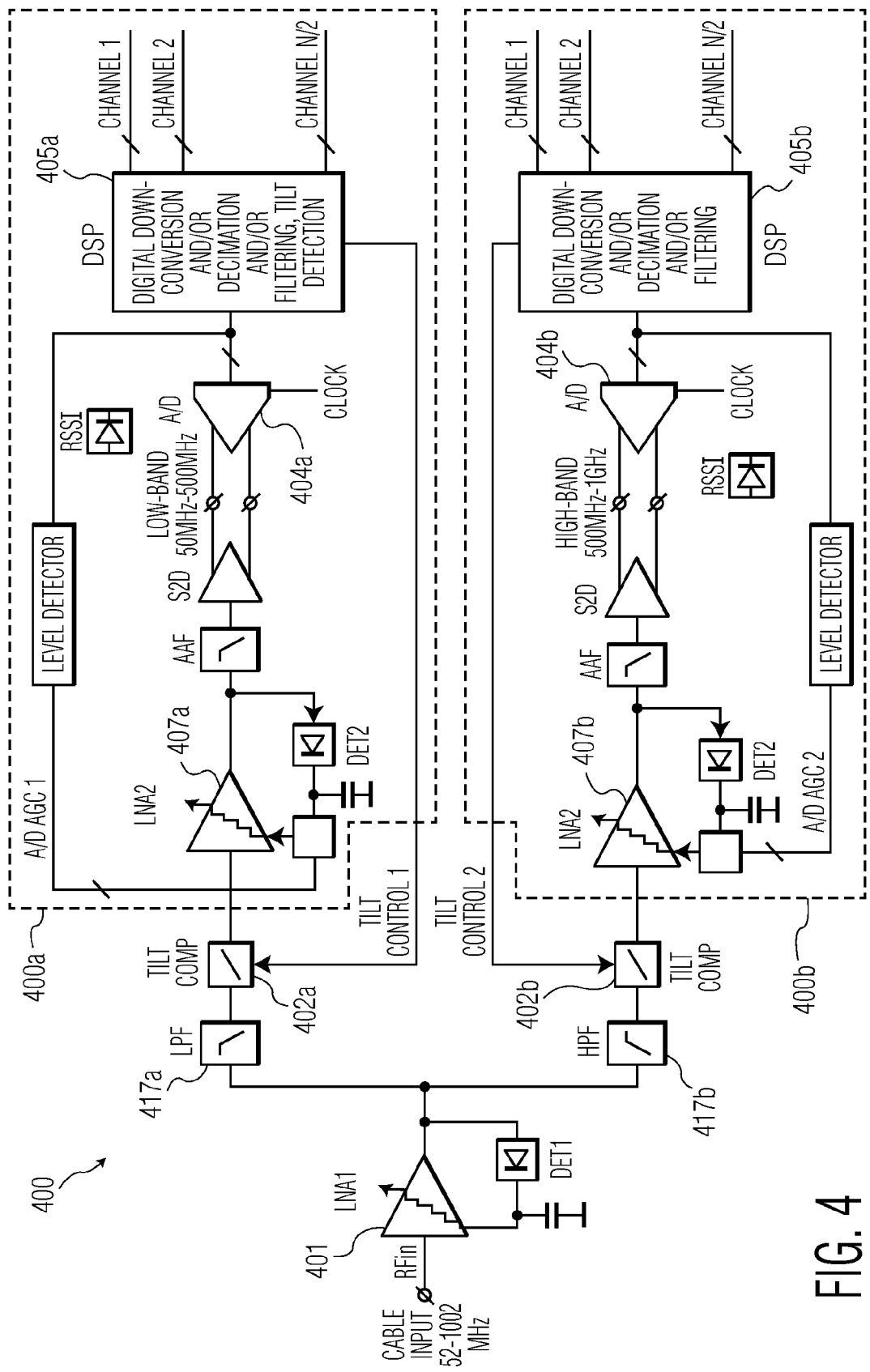
FIG. 4 is a block diagram of a receiver having two ADC signal paths.

An alternative embodiment of receiver 400, in which the input RF signal is split into two separate paths is illustrated in FIG. 4. This embodiment can be made more efficient than the single-channel receiver of FIG. 3, because having two paths allows for performance trade-offs between the ADC and analogue RF block performances, and allows for cost scalability with respect to the operator frequency planning Splitting the signal into two (or more) separate paths therefore allows for a cost reduction through the use of simpler ADCs or enables a more cost-effective higher performance receiver. A first path 400a, for example, may process the low frequency portion of the input bandwidth (50 MHz to 500 MHz), while a second path 400b may process the high frequency portion (500 MHz to 1 GHz). The components used in each path may be configured accordingly.

The receiver 400 splits the 1 GHz bandwidth (52 to 1002 MHz) RF input signal into two 500 MHz signals, each one being sampled and quantized by an ADC 404a, 404b in a respective path 400a, 400b. This allows the required performance of the A/D to be relaxed due to power rejection by filters in each path. A low pass filter (LPF) 417a is connected between the LNA 401 and a first path tilt equalizer 402a, for limiting the bandwidth being fed to the first receiver path 400a. A high pass filter (HPF) 417b is connected between the LNA 401 and a second path tilt equalizer 402b. In the embodiment illustrated, the first path 400a handles reception and decoding of the 50 MHz-550 MHz band, while the second path 400b handles reception and decoding for the 550 MHz-1 GHz band. In other respects, the components in each path are the same as in the converter module 303 of FIG. 3 described above. In cases where the input RF signal has a tilted amplitude distribution, for example a high frequency roll-off, the performance improvement for the higher frequency band path can be significant, due to a noise factor improvement from an increase in gain by the LNA 407b in the second path 400b. For example, in a case where the LPF or HPF reject 7 dB of power, the LNA 407b in the second path 400b can increase its gain, and A/D conversion is facilitated by 7 dB.

The LPF 417a and HPF 417b can be made of relatively low-cost passive components (inductors and capacitors), which are inherently highly linear and of low noise. The LPF and HPF can also be totally integrated, partly integrated (for example with internal capacitors and external inductors), or entirely external to the IC on which the receiver is manufactured. The filters 417a, 417b may also have a controllable cut-off frequency, which enables the signal bandwidth supplied to each path 400a, 400b to be adjusted.

The architecture also allows tailoring of the receiver according to the needs of the system. Some operators, for example, may need to receive a high number of channels in the band 500 M-1 GHz, and only 2 or 3 channels in the lower band (50 MHz-500 MHz). In this case, the system can consist of only one 500 MHz receiver instead of two, which results in a better optimized system solution in terms of cost and power. Traditional narrow-band tuners can be used for the 2 or 3 remaining channels located in the lower band (50 MHz-550 MHz).

Figure 5:
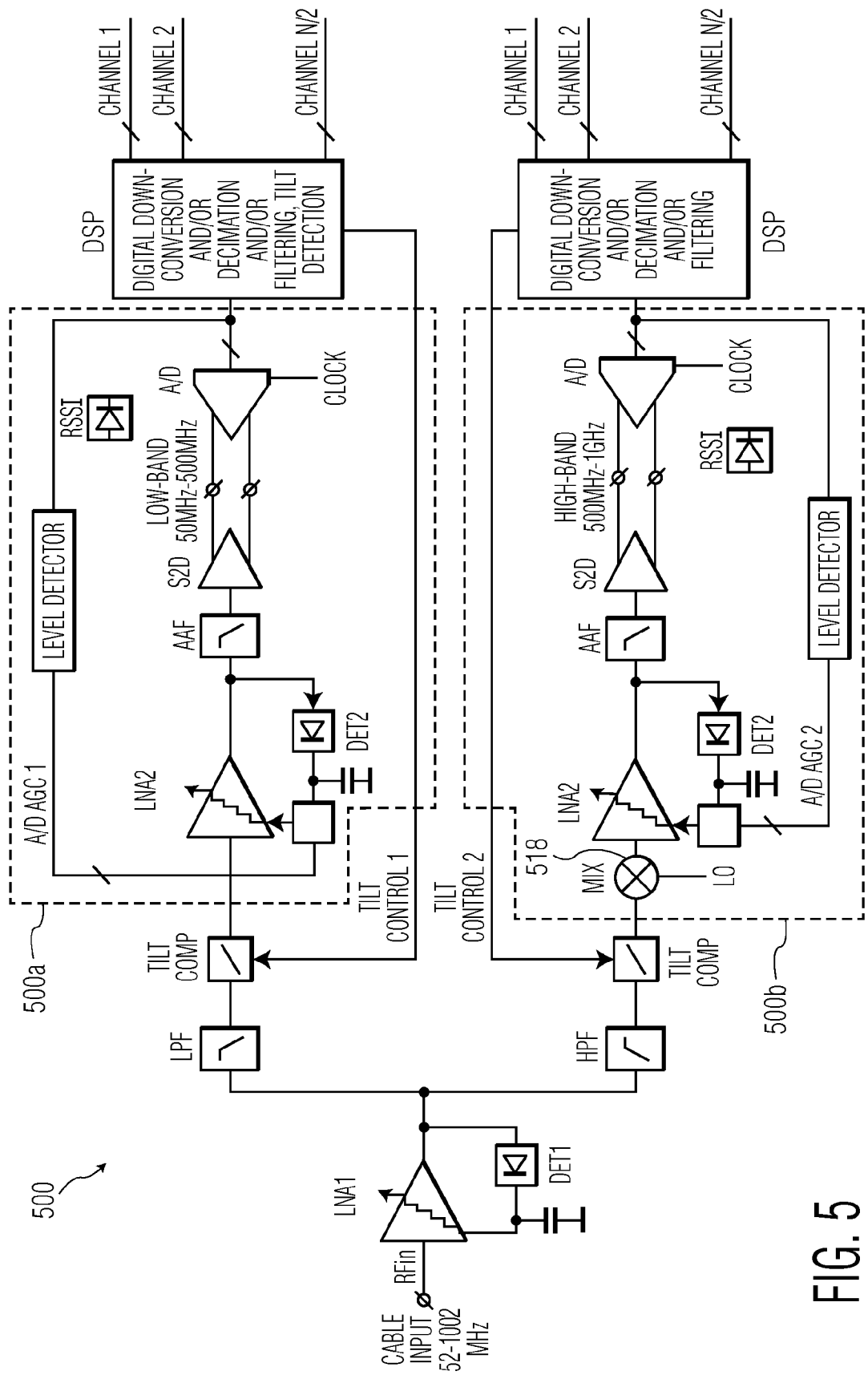
FIG. 5 is a block diagram of an alternative receiver having two ADC signal paths.

Sampling of a high-frequency signal can suffer from several physical limitations, including: high-speed A/D clock requirement, cycle-to-cycle jitter, time skews (in interleaved converters), and non-linearity in the Sample-And-Hold. To address this problem, reception of the high frequency band can be relaxed by the use of down-conversion prior to A/D conversion. An exemplary embodiment of a receiver 500 in which down-conversion is carried out on the higher frequency path is illustrated in FIG. 5. Down-conversion is achieved by means of an image-reject mixer 518 in the second path 500b. The mixer 518 mixes a local oscillator signal LO with the tilt compensated RF signal and provides a down-converted signal for the second path converter module. The components in the receiver 500 in FIG. 5 are otherwise similar to those of FIG. 4.

When a wideband signal is to be received (100 MHz bandwidth for instance), fixed-band splitting as indicated above could be a limitation. One example is when receiving the band 500 MHz-600 MHz. One option would be to allow some overlap between the 2 bands (such as a 100 MHz overlap), but this would result in reduced power rejection in each filter. A better option would be to provide at least one tracking filter whose centre frequencies could be tuned on the frequency band to be received.

Figure 6:
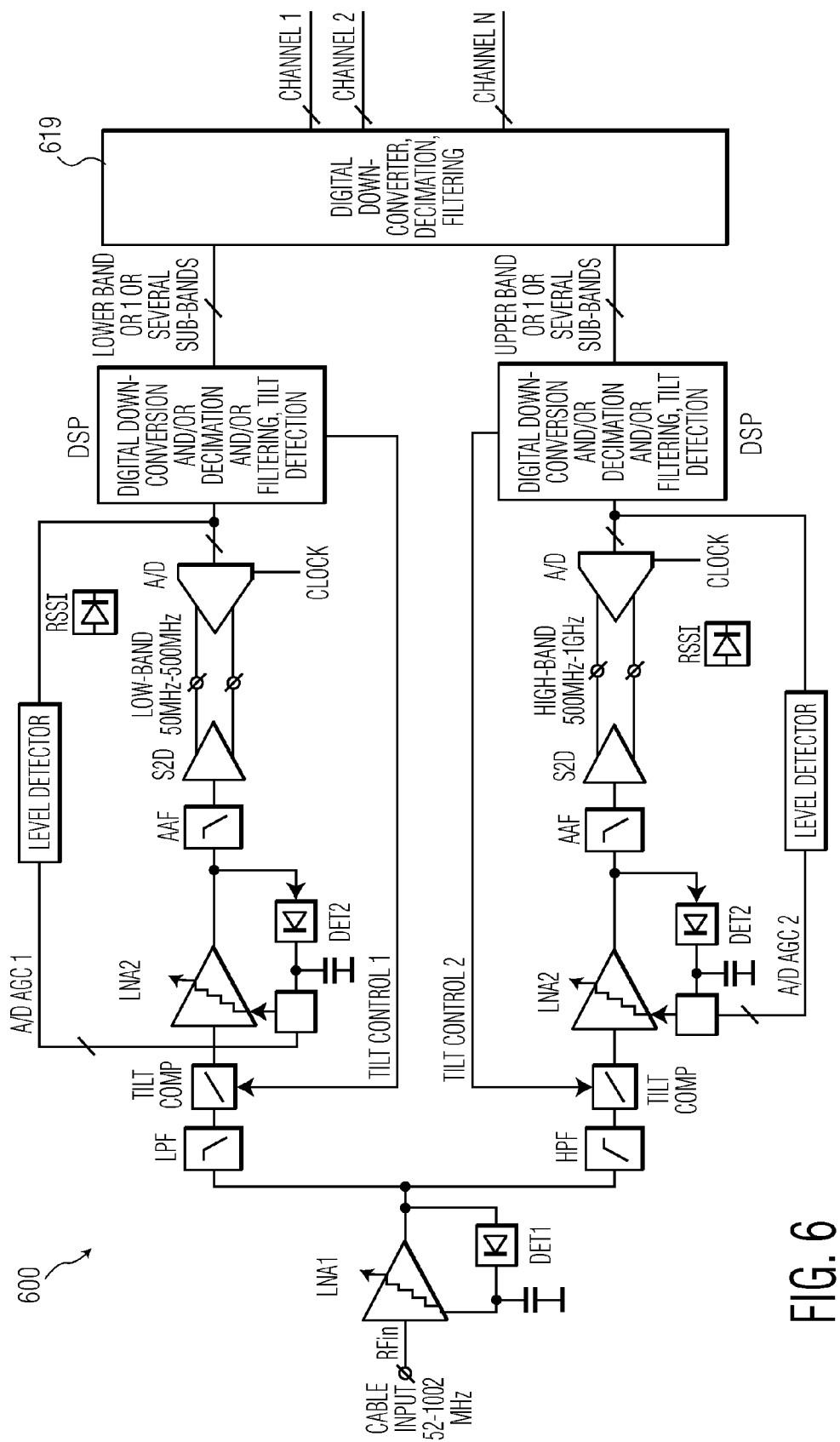
FIG. 6 is a block diagram of a further alternative receiver having two ADC signal paths.

FIG. 6 illustrates a further embodiment of a receiver 600 in which a digital combiner 619 is connected to the outputs of the DSPs in each of the paths. The digital combiner 619 allows a selection of channels to be chosen from the entire available number of channels in the input bandwidth. The receiver 600 is otherwise the same as the receiver 400 in FIG. 4, as described above.

Figure 7:
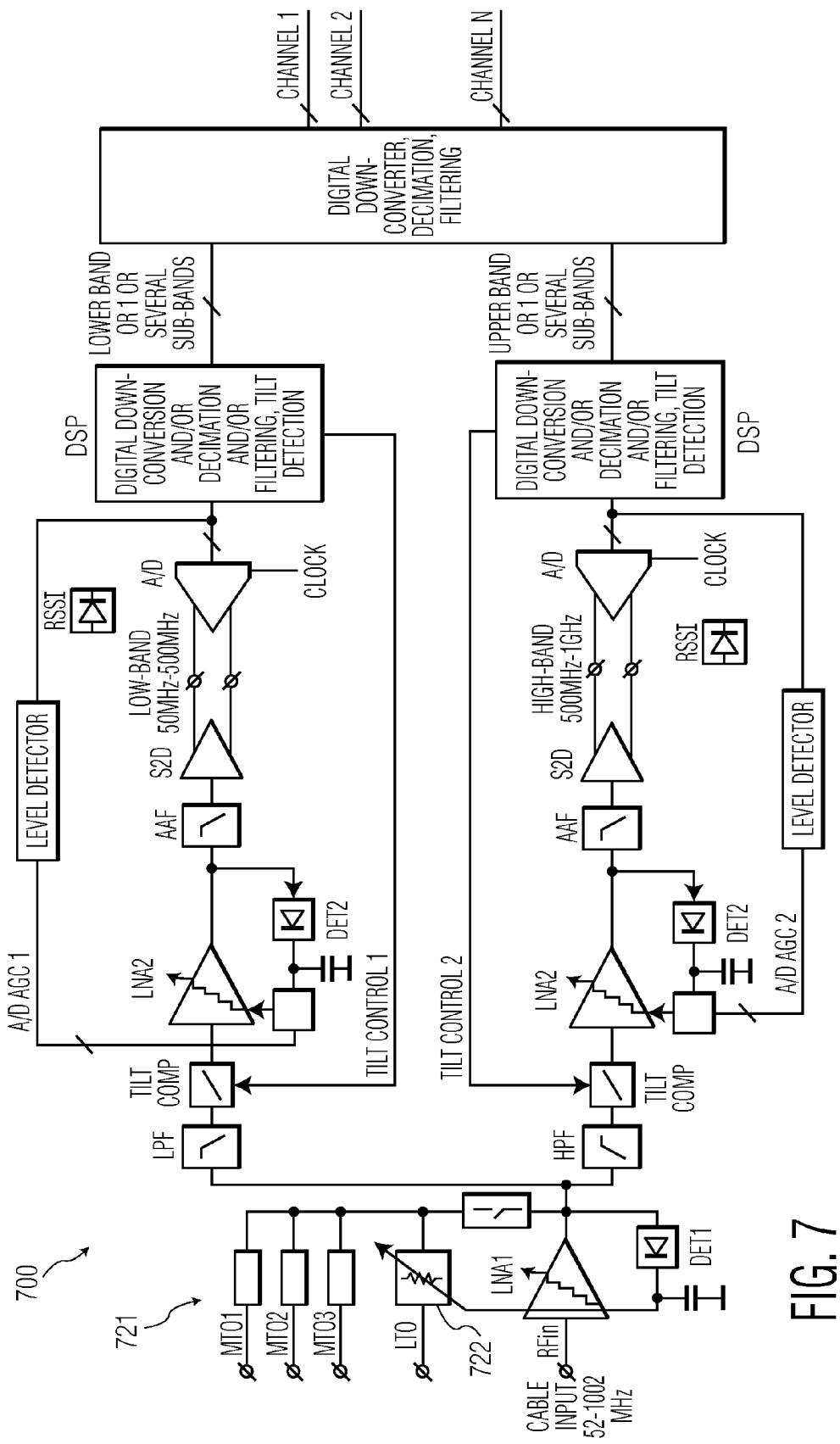
FIG. 7 is a block diagram of a further alternative receiver having two ADC signal paths.

A further embodiment of a receiver 700 is illustrated in FIG. 7, in which RF outputs 721 are provided, for example to provide signals for associated equipment. In cable equipment, there may be a need to split the RF input signal for supply to several other pieces of equipment such as a narrow-band tuner, a wide-band tuner or a PVR. To achieve this functionality, the splitter function may be incorporated into the RF front-end, thereby eliminating the need for an additional RF splitter. This reduces the number of ICs, therefore reducing system cost, and improves system performance due to fewer cascaded stages and a consequential improvement in the trade-off between noise factor and linearity. One of the RF outputs 721 may be in the form of a look-through output (LTO) 722, which provides an amplified version of the received RF signal to other equipment. The LTO 722 may alternatively be connected to the output of a tilt equalizer, to enable an amplified and tilt-compensated version of the RF input signal to be provided to other equipment, thereby removing the need to duplicate components required for tilt compensation. In the embodiment of FIG. 7, two LTOs may be provided, one for each tilt equalizer. In a general aspect therefore, a receiver according to the invention may further comprise an output configured to provide an RF signal derived from an output of the tilt equalizer. One or more such outputs may be provided corresponding to each tilt equalizer in the receiver.

FIGS. 8 to 12 illustrate aspects of an exemplary tilt compensation equalizer for use with the receiver embodiments described above. Through the use of full-band digitization, a tilt in the RF input bandwidth can be readily determined using known efficient Digital Signal Processing techniques. For example, the DSP of any of the embodiments described above may be configured to scan through each of the received channels 1 to N and determine an amplitude for each channel to obtain a measure of tilt across the bandwidth. The DSP may alternatively scan groups of channels rather than each individual channel, which may result in a faster, although less accurate, measure of tilt across the bandwidth.

With reference to the embodiment of FIG. 3, the feedback loop 316 connects the tilt detection point in the Digital Signal Processing with the tilt equalizer 302, operating on the analogue RF signal. In typical embodiments, the use of such a feedback loop 316 allows the receiver to converge to a quasi-flat spectrum at the ADC input, which can relax the ADC dynamic range by more than 15 dB.

For cost and performance reasons, the tilt equalizer 302 is preferably fully integrated into the IC with the remaining components of the receiver. As mentioned above, with reference to FIG. 3, the tilt equalizer 302 is preceded by the LNA 301, and is followed by a further variable gain amplifier (VGA) 307. In order to achieve a low-noise performance, the LNA 301 preferably has a low output impedance, while the VGA 307 has a high input impedance. This ensures a low voltage loss inside the equalizer block, thus guaranteeing low noise addition in the LNA 301, the equalizer 302 and the VGA 307.

In order to obtain a sufficiently flat spectrum at the ADC input, the tilt equalizer 302 preferably comprises a coupled LC resonator, since a first order C-R/R-C filter has limited equalization potential over a decade. The LC resonator is configured as a parallel resonator for positive tilt correction, and as a series resonator for negative tilt correction.

Figure 8:
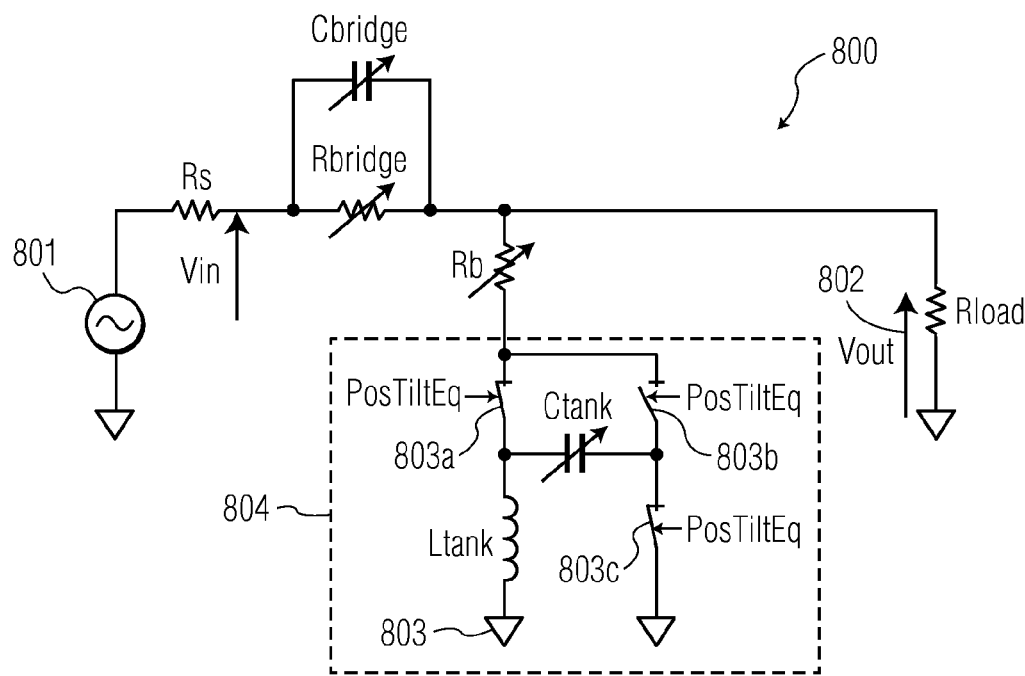
FIG. 8 is a circuit diagram of an adjustable tilt equalizer.
Figure 9:
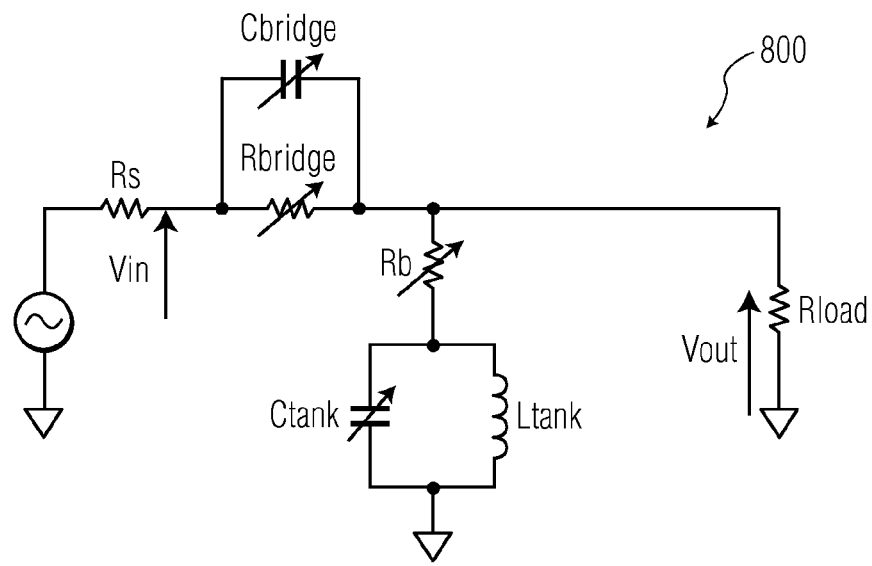
FIG. 9 is a circuit diagram of the tilt equalizer of FIG. 8 configured as a positive tilt equalizer.
Figure 10:
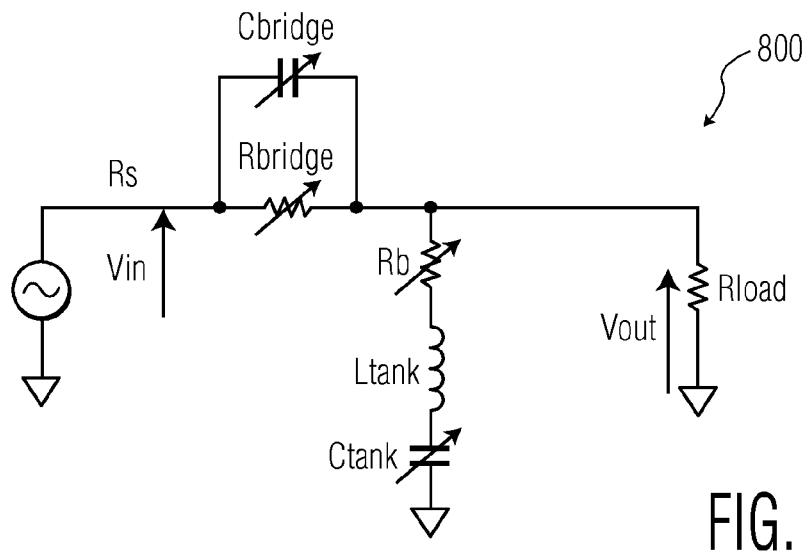
FIG. 10 is a circuit diagram of the tilt equalizer of FIG. 8 configured as a negative tilt equalizer.

An exemplary embodiment of a tilt equalizer 800 configured to provide either a positive or negative tilt correction is shown in FIG. 8. A digital signal sent from the DSP 305 (FIG. 3) controls the values of a series RC bridge connected between an input 801 and an output 802 of the equalizer 800. The RC bridge comprise a variable capacitor Cbridge and a variable resistor Rbridge connected in parallel. A further variable resistor Rb and a further variable capacitor Ctank are connected between the output 802 and ground 803. The variable capacitor Ctank, together with an inductor Ltank, forms an inductor-capacitor (LC) resonator 804. An arrangement of switches 803a-c are provided to allow the coupled LC resonator 804 to be arranged in parallel when the equalizer circuit is in a first operational mode and in series when the equalizer circuit is in the second operational mode. FIG. 9 shows the tilt equalizer 800 configured as a positive tilt corrector, in the first operational mode. FIG. 10 shows the tilt equalizer 800 configured as a negative tilt corrector, in the second operational mode. The switches 803a-c are not shown in FIGS. 9 and 10 for clarity. In the first operational mode of FIG. 9, switches 803a, 803c are closed, while switch 803b is open, resulting in the inductor Ltank and capacitor Ctank being arranged in parallel. In the second operational mode of FIG. 10, switches 803a, 803c are open, while switch 803b is closed, resulting in the inductor Ltank and capacitor Ctank being arranged in series.

By using the same physical components for inductance and capacitance for both parallel and series resonators, the number of components is reduced for the tilt equalizer. This is particularly advantageous for such circuits because the components used in LC resonators tend to be the most bulky in terms of die area when provided on integrated circuits.

Figure 11A:
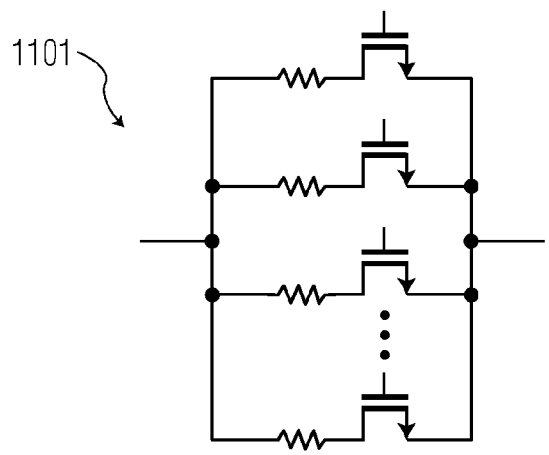
FIGS. 11a and 11b are circuit diagrams of switched resistor and capacitor networks for use in a tilt equalizer.
Figure 11B:
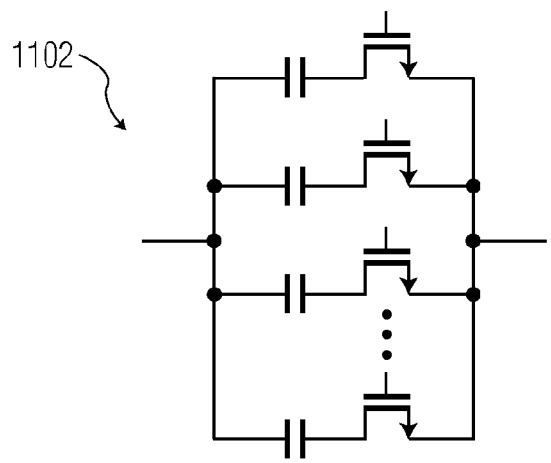

The variable slope of the equalization is realized by means of switched resistances, which are also controlled by the DSP via the feedback loop 316 (FIG. 3). Examples of a resistor network 1101 and a capacitor network 1102 are illustrated in FIGS. 11a and 11b respectively, which are implemented by means of parallel paths of switching transistors and resistors or capacitors.

Figure 12:
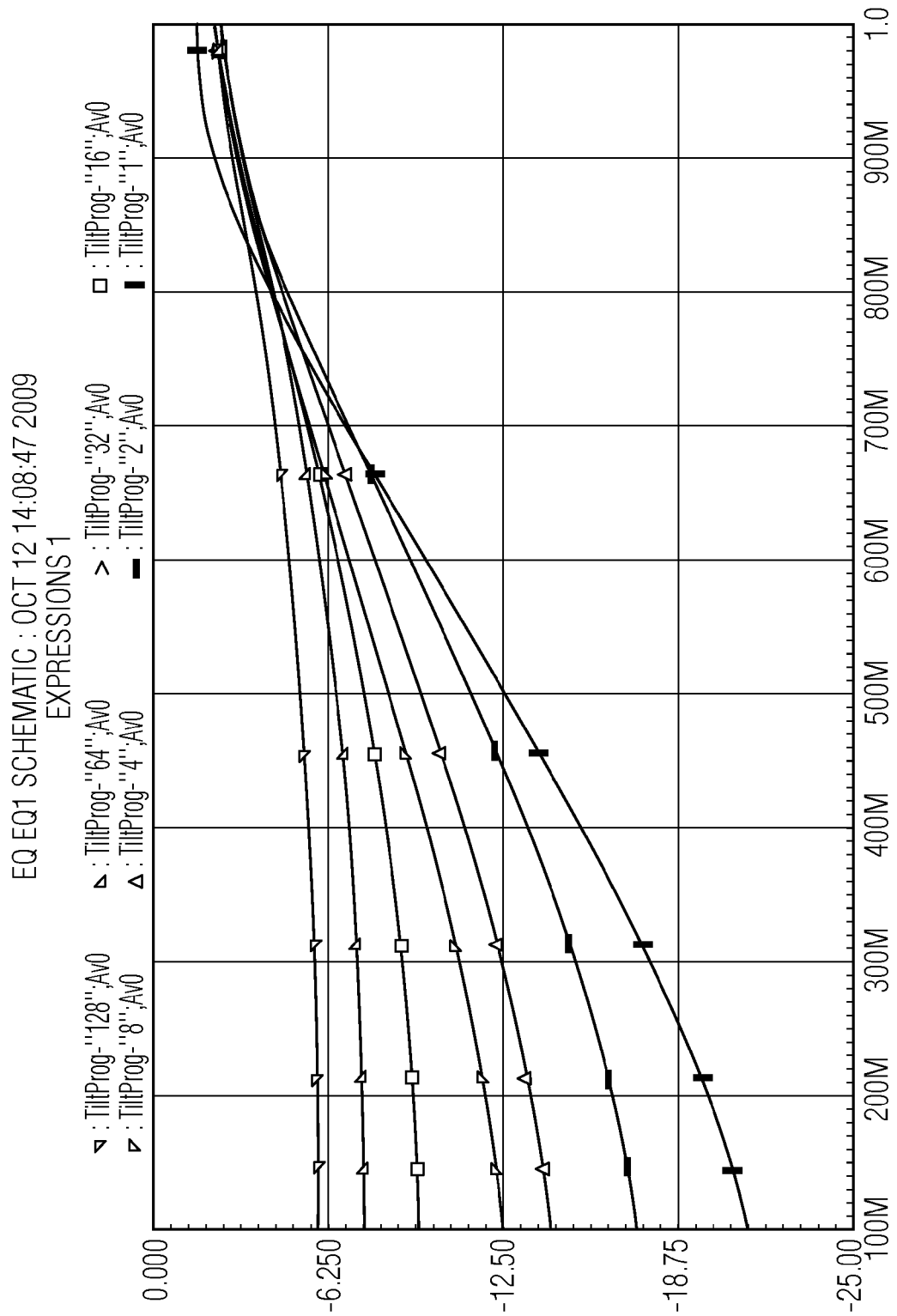
FIG. 12 is a transfer function plot of the tilt equalizer of FIG. 8 when configured as a positive tilt equalizer.

FIG. 12 illustrates a range of transfer functions for an exemplary tilt equalizer operating in a first (positive tilt corrector) operational mode, showing the attenuation of the equalizer as a function of frequency. The frequency ranges from 100 MHz to 1 GHz. While attenuation at the higher end of the frequency range is maintained at a low level, attenuation at the lower end ranges from around 5 dB to around 20 dB.

Figure 13:
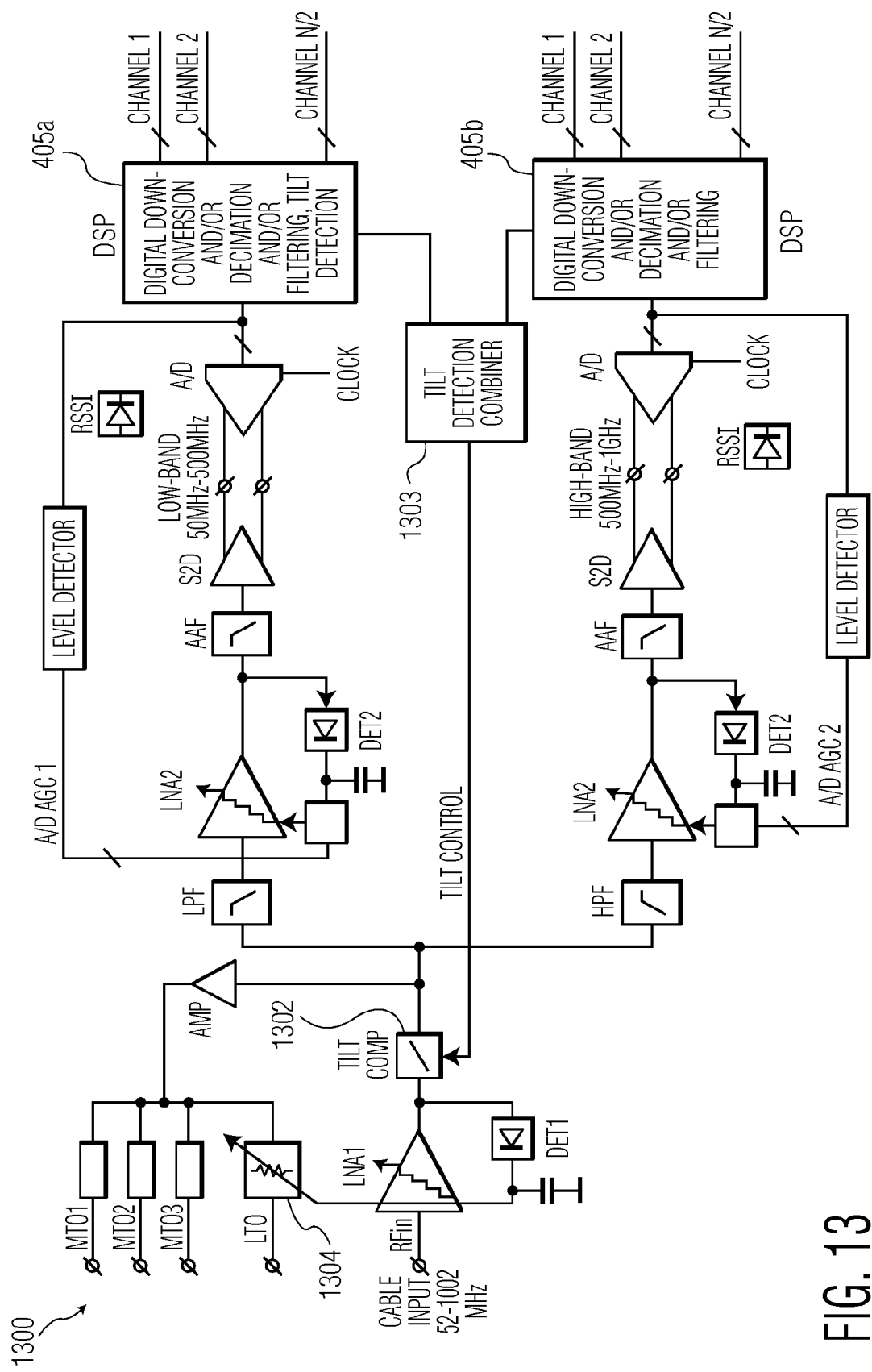
FIG. 13 is a block diagram of a further alternative form of receiver having two ADC signal paths and a single tilt equalizer.

FIG. 13 is a block diagram of a further alternative form of receiver 1300 having two ADC signal paths and a single tilt equalizer 1302. An output of the tilt equalizer 1302 is connected to a converter module in each ADC signal path via a respective filter configured to select a portion of the input bandwidth. The tilt equalizer 1302 is controlled by a tilt detection combiner 1303, which receives output signals from each of the DSP modules 405a, 405b. The components of the receiver 1300 may otherwise be similar to those of any of the embodiments of FIGS. 4-7, described above. A single tilt equalizer may also be used for more that two ADC signal paths.

Also shown in FIG. 13 is an LTO 1304, which is connected (via an optional amplifier) to an output of the tilt equalizer 1302. The LTO 1304 allows other receivers to be connected that can benefit from the equalization provided by the receiver 1300 in which the tilt compensation is carried out.

Other embodiments are intentionally within the scope of the invention as defined by the appended claims.

The invention claimed is:

1. An RF receiver comprising:
an amplifier configured to receive an RF signal over an input bandwidth and to provide an amplified RF signal;
an equalizer circuit connected to the amplifier to receive the amplified RF signal and configured to provide an equalized RF signal;
a converter module connected to the equalizer circuit and including an analog to digital converter configured to convert the equalized RF signal to a digital signal; and
a digital signal processing module connected to the converter module and configured to process the digital signal to provide a plurality of channels at an output of the receiver,
wherein the digital signal processing module is further configured to process the digital signal to determine a measure of tilt in the RF signal across the input bandwidth and is connected to the equalizer circuit to provide a control signal for adjusting the measured tilt, wherein the equalizer circuit comprises a network of switchable impedance elements configured to provide a selectable degree of tilt applied by the equalizer circuit to the amplified RF signal under control of the control signal from the digital signal processing module.

2. The RF receiver of claim 1, wherein the digital signal processing module is configured to provide a control signal to the equalizer circuit to reduce the measure of tilt in the RF signal output from the equalizer circuit.

3. The RF receiver of claim 1, wherein the equalizer circuit is configured to provide, under control of the control signal from the digital signal processing module, a positive tilt equalization to the amplified RF signal in a first operational mode and a negative tilt equalization to the amplified RF signal in a second operational mode.

4. The RF receiver of claim 3, wherein the equalizer circuit comprises a coupled inductor-capacitor resonator arranged in parallel when the equalizer circuit is in the first operational mode and in series when the equalizer circuit is in the second operational mode.

5. The RF receiver of claim 1, wherein the impedance elements comprise a plurality of resistors and a plurality of capacitors.

6. The RF receiver of claim 1, further comprising:
at least two of the equalizer circuit, the converter module and the digital signal processing module, each of the at least two of the equalizer circuit being connected to the amplifier via a respective filter configured to select a portion of the input bandwidth.

7. The RF receiver of claim 6 wherein a first one of said filters is configured as a low pass filter to provide a lower portion of the input bandwidth to a first one of the equalizer circuits and a second one of said filters is configured as a high pass filter to provide an upper portion of the input bandwidth to a second one of the equalizer circuits.

8. The RF receiver of claim 6, wherein a first filter is configured as a low pass filter to provide a lower portion of the input bandwidth to a first converter module and a second filter is configured as a high pass filter to provide an upper portion of the input bandwidth to a second converter module.

9. The RF receiver of claim 8, wherein the second converter module comprises a downmixer connected to the second equalizer circuit, and the downmixer is configured to mix the equalized RF signal with a local oscillator signal to provide an intermediate frequency signal to the analog to digital converter of the second converter module.

10. The RF receiver of claim 1, further comprising:
at least two of the converter module and the digital signal processing module,
wherein an output of the equalizer circuit is connected to each of the at least two of the converter module via a respective filter configured to select a portion of the input bandwidth.

11. An RF receiver comprising:
an amplifier configured to receive an RF signal over an input bandwidth and to provide an amplified RF signal;
an equalizer circuit connected to the amplifier to receive the amplified RF signal and configured to provide an equalized RF signal;
a converter module connected to the equalizer circuit and including an analog to digital converter configured to convert the equalized RF signal to a digital signal; and
a digital signal processing module connected to the converter module and configured to process the digital signal to provide a plurality of channels at an output of the receiver,
wherein the digital signal processing module is further configured to process the digital signal to determine a measure of tilt in the RF signal across the input bandwidth and is connected to the equalizer circuit to provide a control signal for adjusting the measured tilt,
wherein the equalizer circuit is configured to provide, under control of the control signal from the digital signal processing module, a positive tilt equalization to the amplified RF signal in a first operational mode and a negative tilt equalization to the amplified RF signal in a second operational mode, the equalizer circuit comprising a coupled inductor-capacitor resonator arranged in parallel when the equalizer circuit is in the first operational mode and in series when the equalizer circuit is in the second operational mode.

12. The RF receiver of claim 11, wherein the digital signal processing module is configured to provide a control signal to the equalizer circuit to reduce the measure of tilt in the RF signal output from the equalizer circuit.

13. The RF receiver of claim 11, wherein the equalizer circuit comprises a network of switchable impedance elements configured to provide a selectable degree of tilt applied by the equalizer circuit to the amplified RF signal under control of the control signal from the digital signal processing module.

14. The RF receiver of claim 13, wherein the impedance elements comprise a plurality of resistors and a plurality of capacitors.

15. An RF receiver comprising:
   an amplifier configured to receive an RF signal over an input bandwidth and to provide an amplified RF signal;
   a first equalizer circuit connected to the amplifier to receive the amplified RF signal and configured to provide a first equalized RF signal;
   a second equalizer circuit connected to the amplifier to receive the amplified RF signal and configured to provide a second equalized RF signal;
   a first converter module connected to the first equalizer circuit and including a first analog to digital converter configured to convert the first equalized RF signal to a first digital signal;
   a second converter module connected to the second equalizer circuit and including a second analog to digital converter configured to convert the second equalizer RF signal to a second digital signal;
   a first digital signal processing module connected to the first converter module and configured to process the first digital signal to provide a first plurality of channels to an output of the receiver, the first digital a first plurality of channels at an output of the receiver, the first digital signal processing module being further configured to process the first digital signal to determine a measure of tilt in the RF signal across the input bandwidth and connected to the first equalizer circuit to provide a first control signal for adjusting the measured tilt; and
   a second digital signal processing module connected to the second converter module and configured to process the second digital signal to provide a second plurality of channels at an output of the receiver, the second digital signal processing module further configured to process the second digital signal to determine a measure of tilt in the RF signal across the input bandwidth and connected to the second equalizer circuit to provide a second control signal for adjusting the measured tilt;
   wherein the first and second equalizer circuits are configured to provide, under control of respective first and second control signals from the respective first and second digital signal processing modules, a positive tilt equalization to the amplified RF signal in a first operational mode and a negative tilt equalization to the amplified RF signal in a second operational mode, the equalizer circuits each comprising a coupled inductor-capacitor resonator arranged in parallel when the equalizer circuit is in the first operational mode and in series when the equalizer circuit is in the second operational mode wherein each of the first and second equalizer circuits being connected to the amplifier via a respective filter configured to select a portion of the input bandwidth.

16. The RF receiver of claim 15, wherein a first one of said filters is configured as a low pass filter to provide a lower portion of the input bandwidth to a first one of the equalizer circuits and a second one of said filters is configured as a high pass filter to provide an upper portion of the input bandwidth to a second one of the equalizer circuits.

17. The RF receiver of claim 16 wherein the second converter comprises a downmixer connected to the second equalizer circuit, the downmixer being configured to mix the equalized RF signal with a local oscillator signal to provide an intermediate frequency signal to the analog to digital converter of the second converter module.

* * * * *